United States Patent
Reindl et al.

(10) Patent No.: US 9,787,291 B1
(45) Date of Patent: Oct. 10, 2017

(54) SYSTEM AND METHOD FOR A SWITCHED CAPACITOR CIRCUIT

(71) Applicant: Infineon Technologies AG, Neubiberg (DE)

(72) Inventors: Christian Reindl, Villach (AT); Michael Kropfitsch, Koettmannsdorf (AT); Peter Bogner, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/385,527

(22) Filed: Dec. 20, 2016

(51) Int. Cl.
*H03M 1/12* (2006.01)
*H03H 19/00* (2006.01)
*H03M 3/00* (2006.01)

(52) U.S. Cl.
CPC ........ *H03H 19/004* (2013.01); *H03M 3/422* (2013.01); *H03M 3/464* (2013.01)

(58) Field of Classification Search
CPC .... H03H 19/004; H03M 3/422; H03M 3/464; H03M 1/806

USPC ........................................ 341/150, 155, 144
See application file for complete search history.

(56) References Cited

U.S. PATENT DOCUMENTS

| | | | | |
|---|---|---|---|---|
| 8,125,262 B2* | 2/2012 | Kusuda | ................. | G06G 7/186 327/337 |
| 8,614,639 B1* | 12/2013 | Yin | ......................... | H03M 1/56 341/144 |
| 9,035,693 B2* | 5/2015 | Pan | .......................... | H03F 1/34 327/307 |
| 9,218,514 B2* | 12/2015 | Kim | ..................... | H03M 3/496 |

* cited by examiner

*Primary Examiner* — Brian Young
(74) *Attorney, Agent, or Firm* — Slater Matsil, LLP

(57) ABSTRACT

In accordance with an embodiment, a method of operating a switched capacitor circuit includes pre-charging a capacitor using a voltage buffer having an input coupled to an input node of the switched capacitor circuit and an output coupled to the capacitor, coupling the input node to the capacitor, wherein a first charge is collected on the capacitor, and integrating the first charge using an integrator.

19 Claims, 7 Drawing Sheets

SYSTEM AND METHOD FOR A SWITCHED CAPACITOR CIRCUIT

TECHNICAL FIELD

The present invention relates generally to electronic circuits and more particularly to a system and method for a switched capacitor circuit.

BACKGROUND

Analog to digital converters are commonly used in many electronic applications in order to convert analog signals to digital signals. In the real world, most data or signals are characterized by analog signals, for example, temperature, voice, light, pressure, and so forth. These analog signals, which are continuous in time and amplitude, are converted to digital signals that are discrete with respect to time and quantized with respect to amplitude by an ADC. The ADC architectures vary based on the end applications, cost, speed and resolution. Various types of ADCs include, for example, Flash ADCs, Delta-sigma ADCs, Successive approximation type ADCs and dual slope ADCs.

One common application in which ADCs are being increasingly used is in the automotive industry. ADCs may be used, for example, to digitize analog signals provided various sensors within the automobile such as pressure sensors, temperature sensors, accelerometers, and position sensors used within the engine, transmission and exhaust systems of the automobile. Often, these sensors are connected to an ADC of an engine controller using long, inductive wiring within the automobile's chassis. The length of these wires, as well as their proximity to generators electric and mechanical disturbances make them prone to coupling high voltage transients that may potentially damage sensitive circuitry within the integrated ADCs to which the wires are connected. In order to prevent damage to sensitive electronic components, various protection devices may be used, such as resistors, diodes and transistors in order to suppress high voltages and currents. These added protection components, however, may compromise the accuracy and operation of the ADC.

SUMMARY

In accordance with an embodiment, a method of operating a switched capacitor circuit includes pre-charging a capacitor using a voltage buffer having an input coupled to an input node of the switched capacitor circuit and an output coupled to the capacitor, coupling the input node to the capacitor, wherein a first charge is collected on the capacitor, and integrating the first charge using an integrator.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present disclosure will be described with respect to preferred embodiments in a specific context, switched capacitor circuit used in oversampled data converters. Embodiments of the present disclosure may also be applied to various systems that utilize switched capacitor circuits, such as sensor and microphone interfaces.

In an embodiment, the effective input impedance of a switched capacitor circuit is increased by pre-charging a sampling capacitor with a buffer circuit prior to connecting the sampling capacitor to an input port. By charging the sampling capacitor close to its final voltage using the buffer circuit, a smaller amount of current flows from the input port to the capacitor when the input is connected compared to the total amount of current is used to charge the capacitor via the buffer circuit. This decrease in charging current effectively appears as a reduced input impedance from the perspective of the input port. In some embodiments, a low current buffer circuit may be used that only partially pre-charges the capacitor prior to the input port being connected, thereby providing power savings.

By increasing the input impedance of the switched capacitor circuit in this manner, the switched capacitor circuit itself can be operated using higher source impedances. For example, in one embodiment in which the switched capacitor circuit is implemented on an integrated circuit, a resistor having a high resistance may be coupled between the input port and the input of the switched capacitor circuit. The resistor may be used, for example, to protect the input of the switched capacitor circuit from high electrostatic discharge (ESD) currents.

Figure 1:
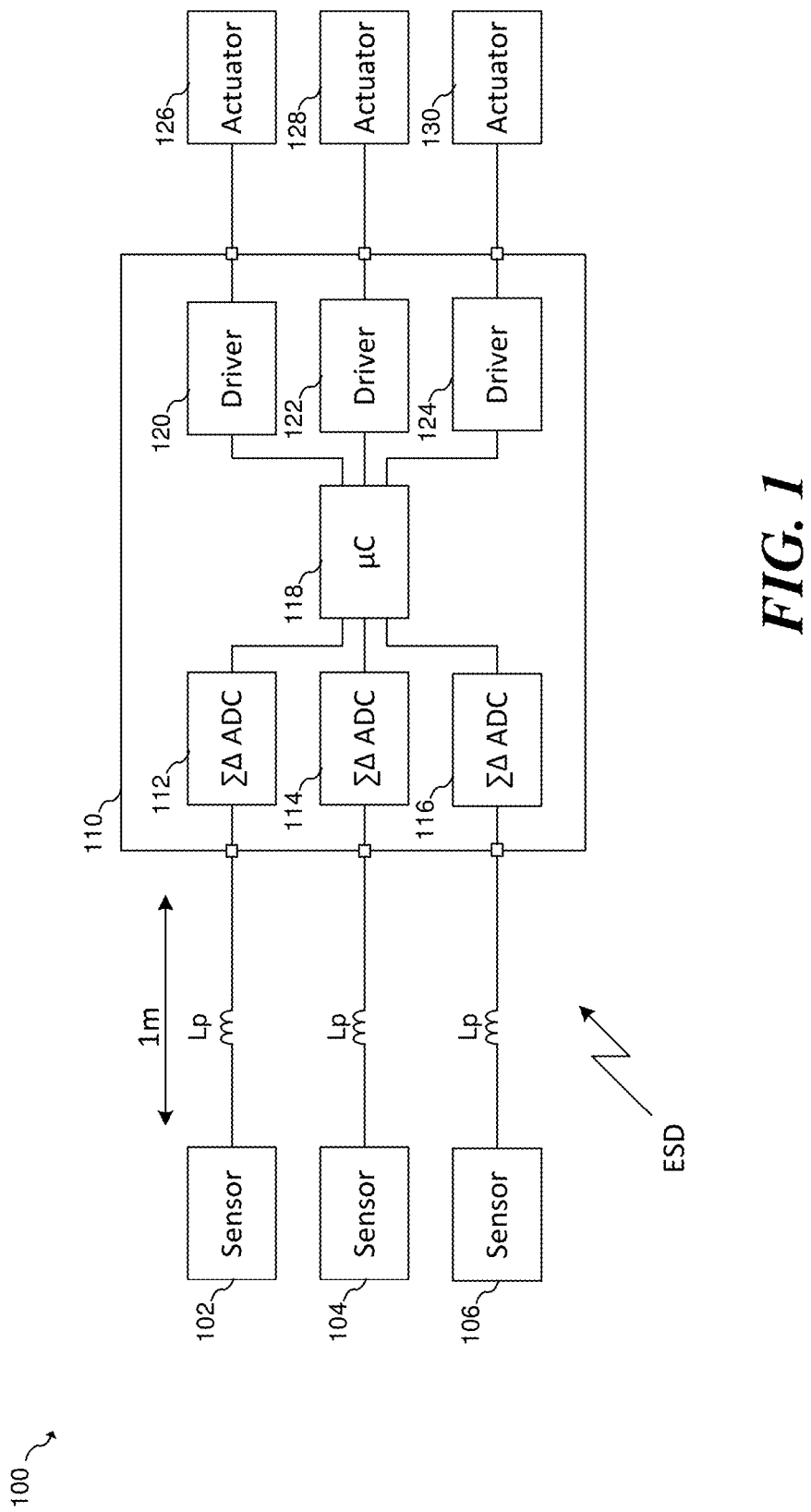
FIG. 1 illustrates a block diagram of microcontroller-based electronic system 100.

FIG. 1 illustrates a block diagram of a microcontroller-based electronic system 100 that may be used, for example, in a variety of automotive and industrial applications. As shown, system 100 includes an integrated circuit 110 that includes a plurality of sigma-delta analog to digital converters (ΣΔ ADCs) 112, 114 and 116, the outputs of which are coupled to on-chip microcontroller 118. Driver circuits 120, 122 and 124 are also coupled to microcontroller 118. As shown each ΣΔ ADC 112, 114 and 116 is coupled to a corresponding sensor circuit 102, 104 and 106; and each driver circuit 120, 122 and 124 are coupled to a corresponding actuator circuit 126, 128 and 130.

System 100 may be adapted to a variety of system applications. For example, in an engine control system sensors 102, 104 and 106 may represent, for example, various automotive air pressure, throttle position, pedal position sensors, as well as other types of sensors. Actuators 126, 128 and 130 may represent, for example, various relays and solenoids used in valves, fuel injectors, braking and other systems. Alternatively, system 100 may be adapted to other types of systems including but not limited to power inverters and hydraulic and pneumatic management systems.

One issue that may arise with in automotive and industrial systems is noise and transients being induced into the wiring and cables that connected sensors 102, 104 and 106 to integrated circuit 110. In the illustrated example, each of the wires that connected sensors 102, 104 and 106 to integrated circuit 110 are about 1 meter in length, and the wiring inductance of these cables are represented by parasitic inductance Lp. High current transients generated during the operation of an automobile or industrial equipment may couple onto parasitic inductances Lp and create a high voltage transient on each of the lines. In order to avoid damage and destruction to the sensitive transistors on integrated circuit 110, ESD protection devices, such as protection diodes and series resistance may be used to mitigate the effects of ESD. However, the use of such protection devices may degrade the operation and performance of ΣΔ ADCs 112, 114 and 116.

In various embodiments, integrated circuit 110 may be implemented on a single semiconductor substrate, such as a silicon substrate. The circuitry on integrated circuit 110 may be implemented using various fabrication technologies such as CMOS, BiCMOS and other technologies depending on the particular system and its specifications.

Figure 2A:
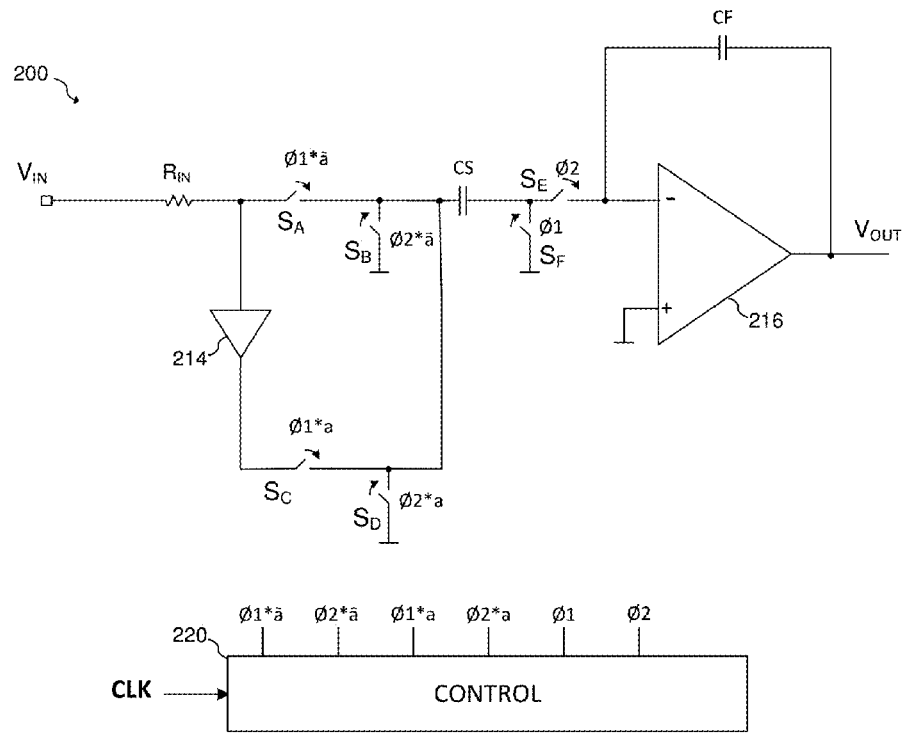
FIG. 2a illustrates a schematic of an embodiment switched capacitor integrator.

FIG. 2a illustrates a single ended integrator circuit 200 that may be used to implement the front-end circuit of A ADCs 112, 114 and 116 shown in FIG. 1. During operation, resistor $R_{IN}$ protects the various devices within integrator circuit 200 from high voltages and high currents that may be present at input $V_{IN}$. In order to address the increased RC time constant introduced by resistor $R_{IN}$, voltage buffer 214 is used to pre-charge series capacitor CS prior to series capacitor being coupled to input pin $V_{IN}$ via a switch $S_A$. In various embodiments, voltage buffer 214 may be used to only partially charge series capacitor CS. When input pin $V_{IN}$ is coupled to capacitor CS after CS has been pre-charged, capacitor CS continues to be charged via resistor $R_{IN}$. As such, high linearity may be achieved even when voltage buffer 214 is configured to only partially charge capacitor CS.

As shown, integrator circuit 200 includes series capacitor CS, operational amplifier 216 and feedback capacitor CF. Series capacitor CS is coupled to the input $V_{IN}$ via a first switching network that includes switches $S_A$ and $S_B$. A voltage buffer 214 further couples input $V_{IN}$ to series capacitor CS via a second switching network that includes switches $S_C$ and $S_D$, and series capacitor CS is further coupled to the negative input of operational amplifier 216 via a third switching network that includes switches $S_E$ and $S_F$. Control circuit 220 represents switch control logic that drives control signals Ø1*ā, Ø2*ā, Ø1*a, Ø2*a, Ø1 and Ø2 connected to the control ports of switches $S_A$, $S_B$, $S_B$, $S_C$, $S_D$, $S_E$ and $S_F$ respectively. In various embodiments, each of switches $S_A$, $S_B$, $S_B$, $S_C$, $S_D$, $S_E$ and $S_F$ may be implemented, for example, in a bulk CMOS process using an NMOS transistor, a PMOS transistor and/or a CMOS transmission gate in which the NMOS and PMOS transistors are connected in parallel and driven in a complementary manner. Alternatively, other switching transistor types may be used according to the particular fabrication technology used. Control circuit 220 may be implemented using a digital state machine or other digital control circuit structures known in the art.

Voltage buffer 214 may be implemented using voltage buffer circuits known in the art and operational amplifier may be implemented using operational amplifier circuits known in the art. In one particular embodiment, voltage buffer 214 is implemented using rail-to-rail input and output stages in which the input stage includes an NMOS differential pair and a PMOS differential pair. In various embodiments, the settling time of voltage buffer 214 is between about three and about five RC time constants, where the RC time constant is the product of the resistance of resistor $R_{IN}$ and the capacitance of series capacitor CS. Alternatively, time constants outside of this range may be used.

Figure 2B:
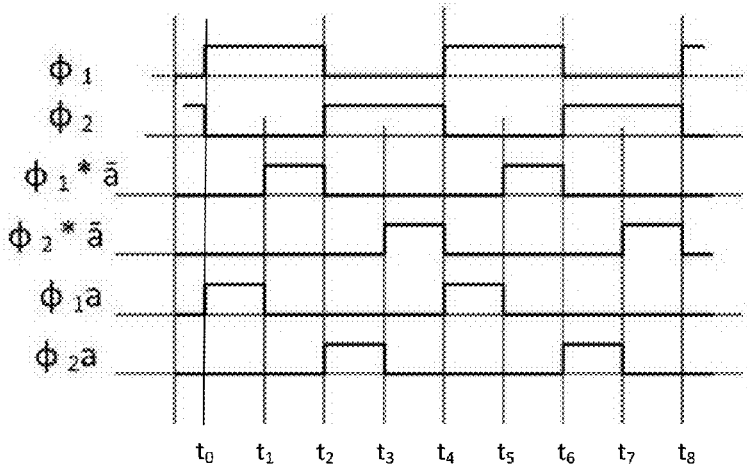
FIG. 2b illustrates an accompanying waveform diagram.

FIG. 2b shows a timing diagram that illustrates the relative timing of control signals Ø1*ā, Ø2*ā, Ø1*a, Ø2*a, Ø1 and Ø2. At time $t_0$, control signals Ø1 and Ø1*a are asserted, which effectively couples node $V_{IN}$ to the first terminal of series capacitor CS via voltage buffer 214, and couples the second terminal of series capacitor CS to ground. From time $t_0$ to $t_1$ capacitor CS is pre-charged via voltage buffer 214. At time $t_1$ signals Ø1 and Ø1*ā are activated, which directly couples node $V_{IN}$ to the first terminal of series capacitor CS, disconnects series capacitor CS from the output of voltage buffer 214, and couples the second terminal of series capacitor CS to ground. Thus, from time $t_0$ to about time $t_2$, series capacitor CS is charged.

At time $t_2$, control signals Ø2 and Ø2*a are asserted, which effectively couples the first terminal of series capacitor CS to ground via switch $S_D$ and couples the negative input of operational amplifier 216 to the second terminal of series capacitor CS via switch $S_E$. At time $t_3$, control signals Ø2 and Ø2*ā are asserted, which effectively couples the first terminal of series capacitor CS to ground via switch $S_B$ and couples the negative input of operational amplifier 216 to the second terminal of series capacitor CS via switch $S_E$. Thus, from time $t_2$ to about time $t_4$, the charge that was stored on series capacitor CS while control signal Ø1 was active is transferred to feedback capacitor CF while control signal Ø2 is active. From time $t_4$ to time $t_8$ the above-described operation cycle repeats itself, and continues to repeat itself. In some single-ended integrator embodiments, such as that shown in FIG. 2a, the operation of switches $S_B$ and $S_D$ may be merged into a single switch that is controlled by control signal Ø2. In some embodiments of the present invention, each of the control signals Ø1*ā, Ø2*ā, Ø1*a, Ø2*a, Ø1 and Ø2 are operated in a non-overlapping manner to avoid charge leakage.

Figure 2C:
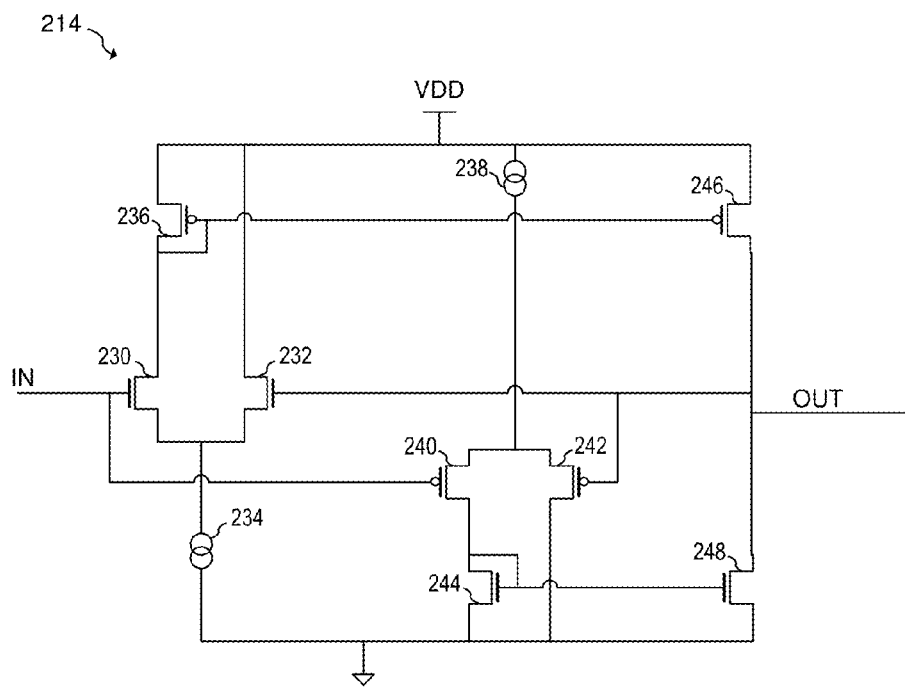
FIG. 2c illustrates an embodiment voltage buffer of the switched capacitor integrator.

FIG. 2c illustrates an embodiment rail-to-rail buffer circuit 214 that may be used to implement buffer circuit 214 shown in FIG. 2a. As shown, buffer circuit has an NMOS differential pair input stage that includes NMOS transistors 230 and 232 and is biased by current source 234, as well as a PMOS differential pair input stage that include PMOS transistors 240 and 242 and is biased by current source 238. The drain current of NMOS transistor 230 of the NMOS differential pair is mirrored to output node OUT via a PMOS current mirror that includes PMOS transistors 236 and 246, while the drain current of PMOS transistor 240 of the PMOS differential pair is mirrored to output node OUT via an NMOS current mirror that includes NMOS transistors 244 and 248. Input node IN is coupled to the gate of NMOS transistor 230 of the NMOS differential pair and to the gate of PMOS transistor 240 of the PMOS differential pair. Unity gain feedback is provided from output node out to the gates of NMOS transistor 232 and PMOS transistor 242.

During operation, when the voltage of input node IN is mid-rail such that both the NMOS differential pair and the PMOS differential pair are in compliance, the outputs of both NMOS and PMOS differential pairs are mirrored to output node OUT via the respective NMOS and PMOS current mirrors. When the input voltage node IN is low enough that NMOS transistors 230 and 232 are turned off, operation of the buffer is maintained by transistors 240 and 242 of the PMOS differential pair, as well as by NMOS transistors 244 and 248. Similarly, when the input voltage node IN is high enough that PMOS transistors 240 and 242 are turned off, operation of the buffer is maintained by transistors 230 and 232 of the NMOS differential pair, as well as by PMOS transistors 236 and 246. It should be understood that rail-to-rail buffer circuit 214 shown in FIG. 2c is just one of many possible buffer implementations that could be used in embodiment switched capacitor circuits described herein.

Figure 3A:
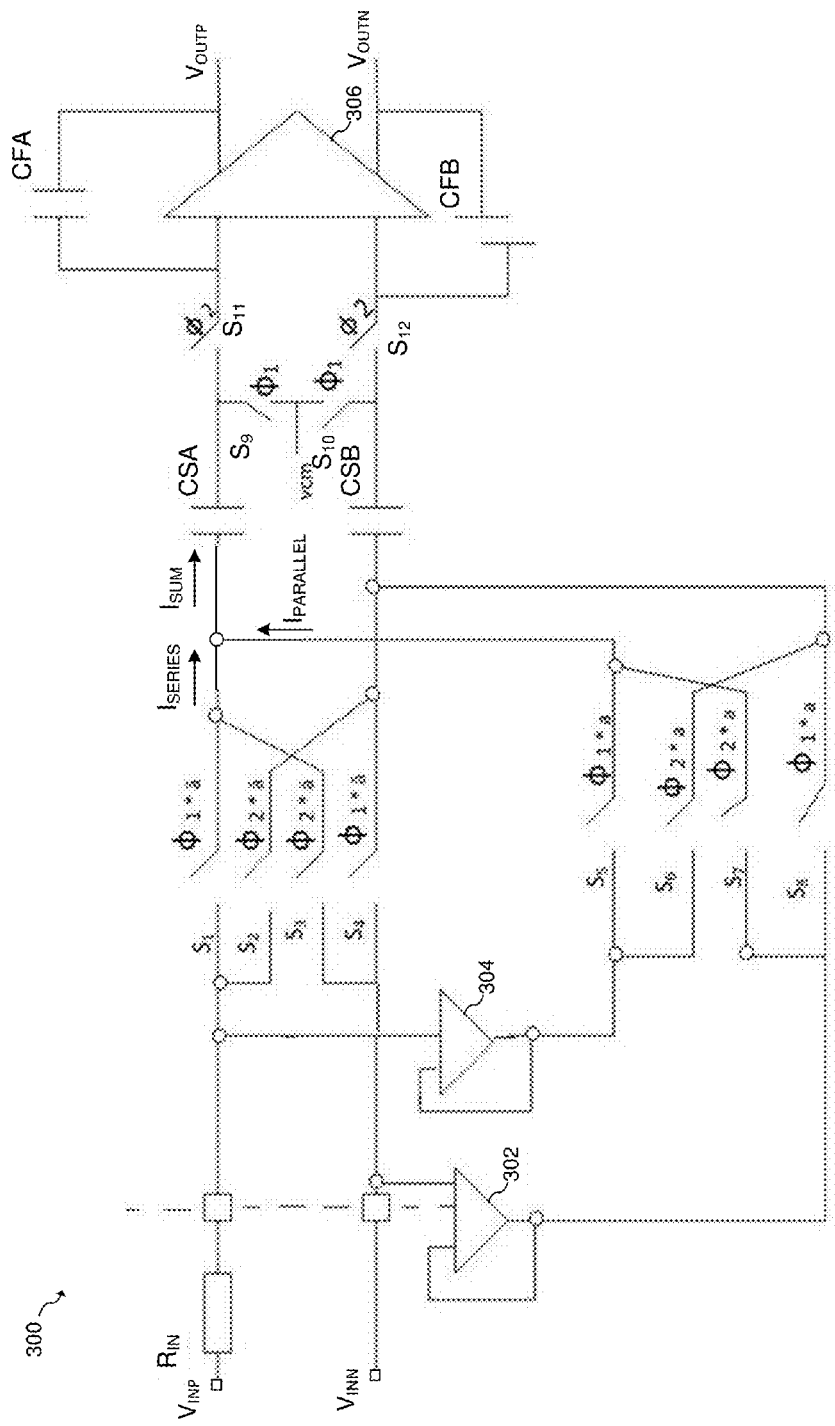
FIGS. 3a and 3b illustrate a schematics of a further embodiment switched capacitor integrators.

FIG. 3a illustrates differential integrator 300 according to a further embodiment of the present invention. The principle of operation of differential integrator 300 is similar to the principle of operation of singled-ended integrator 200 shown in FIG. 2a. However, differential integrator 300 includes a differential signal path in which series capacitor CS is implemented using two series capacitors CSA and CSB and feedback capacitor CF is implemented using capacitors CFA and CFB. Operational amplifier 306 may be implemented using fully differential amplifier circuits known in the art.

Series capacitors CSA and CSB are coupled to inputs $V_{INP}$ and $V_{INN}$ via a first switching network that includes switches $S_1$, $S_2$, $S_3$, and $S_4$. Voltage buffers 302 and 304 further couples inputs $V_{INP}$ and $V_{INN}$ via to series capacitors CSA and CSB via a second switching network that includes switches $S_5$, $S_6$, $S_7$, and $S_8$. Series capacitors CSA and CSB are further coupled to the inputs of operational amplifier 306 via a third switching network that includes switches $S_9$, $S_9$, $S_{11}$, and $S_{12}$. Control circuit 220 shown in FIG. 2a may be used to generate control signals Ø1*ā, Ø2*ā, Ø1*a, Ø2*a, Ø1 and Ø2 connected to the control ports of switches $S_1$, $S_2$, $S_3$, $S_4$, $S_5$, $S_6$, $S_7$, $S_8$, $S_9$, $S_9$, $S_{11}$, and $S_{12}$. In various embodiments, each of switches $S_1$, $S_2$, $S_3$, $S_4$, $S_5$, $S_6$, $S_7$, $S_8$, $S_9$, $S_9$, $S_{11}$, and $S_{12}$ may be implemented, for example, in a bulk CMOS process using an NMOS transistor, a PMOS transistor and/or a CMOS transmission gate in which the NMOS and PMOS transistors are connected in parallel and driven in a complementary manner. Alternatively, other switching transistor types may be used according to the particular fabrication technology used.

Voltage buffers 302 and 304 may be implemented in a similar manner as voltage buffer 214 described above with respect to FIGS. 2a and 2c. In various embodiments, the settling time of voltage buffer 214 is between about three and about five RC time constants, where the RC time constant is the product of the resistance of resistor $R_{IN}$ and the capacitance of series capacitor CS. Alternatively, time constants outside of this range may be used.

Operation of integrator 300 proceeds according to the timing diagram shown in FIG. 2a. At time $t_0$, control signals Ø1 and Ø1*a are asserted, which effectively couples node $V_{INP}$ to the first terminal of series capacitor CSA via voltage buffer 304 and switch $S_5$, coupled node $V_{INN}$ to the first terminal of series capacitor CSB via voltage buffer 304 and switch $S_8$, and couples common mode voltage vcm to the second terminal of capacitor CSA via switch $S_9$ and to the second terminal of capacitor CSB via switch $S_{10}$. Thus, from time $t_0$ to $t_1$ series capacitors CSA and CSB are pre-charged via voltage buffers 304 and 302. At time $t_1$ signals Ø1 and Ø1*ā are activated, which directly couples node $V_{INP}$ to the first terminal of series capacitor CSA via switch $S_1$ and couples node $V_{INN}$ to the first terminal of series capacitor CSB via switch $S_4$. Thus, from time $t_1$ to about time $t_2$, series capacitors CSA and CSB are charged directly from inputs $V_{INP}$ and $V_{INN}$.

At time $t_2$, control signals Ø2 and Ø2*a are asserted, which effectively couples node $V_{INP}$ to the first terminal of series capacitor CSB via voltage buffer 304 and switch $S_6$, coupled node $V_{INN}$ to the first terminal of series capacitor CSA via voltage buffer 302 and switch $S_7$, couples the positive input of amplifier 306 to the second terminal of series capacitor CSA via switch $S_{11}$, and couples the negative input of amplifier 306 to the second terminal of series capacitor CSB via switch $S_{12}$. At time $t_3$, control signals Ø2 and Ø2*ā are asserted, which effectively couples the first terminal of series capacitor CSB to node $V_{INP}$ via switch $S_3$ and couples the first terminal of series capacitor CSA to node $V_{INN}$ via switch $S_2$. Thus, from time $t_2$ to about time $t_4$, the charge stored on series capacitors CSA and CSB is transferred to feedback capacitors CFA and CFB while control signal Ø2 is active. In some embodiments of the present invention, each of the control signals Ø1*ā, Ø2*ā, Ø1*a, Ø2*a, Ø1 and Ø2 are operated in a non-overlapping manner to avoid charge leakage.

In one embodiment, the resistance of resistor $R_{IN}$ is about 15 KΩ, capacitors CSA and CSB are about 20 fF and capacitors CFA and CFB are about 2 pF. It should be appreciated, however, that these component values are just an example of many possible component values that could be used in embodiment integrators.

Figure 3B:
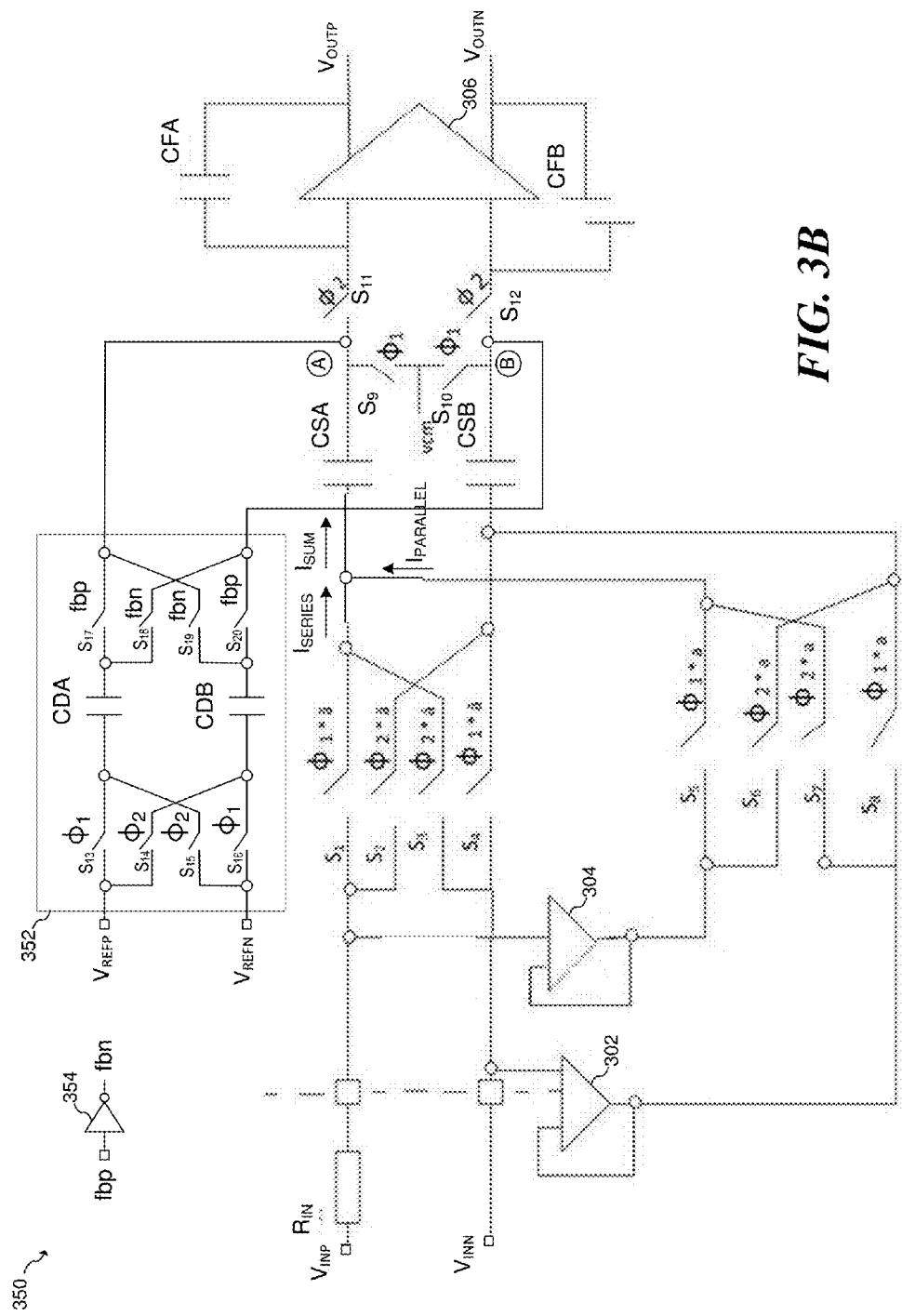

In an embodiment, switched capacitor integrator 200 shown in FIG. 2a and switched capacitor integrator 300 shown in FIG. 3a may be adapted to be the first integrator at the front end of a ΣΔ ADC as shown in FIG. 3b, which illustrates switched capacitor integrator 350. Switched capacitor integrator 350 shown in FIG. 3b has the same structure as switched capacitor integrator 300 shown in FIG. 3a with the addition of a one-bit switched capacitor DAC 352 that is coupled to nodes A and B of the integrator. DAC 352 is coupled to differential reference voltages $V_{REFP}$ and $V_{REFN}$ that has a differential voltage of the full scale input or a fraction thereof. Signal fbp represents a digital output of the comparator or quanitzer (See FIG. 6) of the ΣΔ ADC, and signal fbn is the inverse of signal fbp generated using inverter 354. (See FIG. 6.)

As shown, DAC 352 includes a first DAC switching network that includes switches $S_{13}$, $S_{14}$, $S_{15}$, and $S_{16}$, capacitors CDA and CDB, and a second DAC switching network that includes switches $S_{17}$, $S_{18}$, $S_{19}$, and $S_{20}$. During operation, switches $S_{13}$ and $S_{16}$ of the first DAC switching are activated when control signal Ø1 is asserted and switches $S_{14}$ and $S_{15}$ of the first DAC switching network are activated when control signal Ø2 is asserted. Similarly, switches $S_{17}$ and $S_{20}$ of the second DAC switching are activated when feedback signal fbp is asserted and switches $S_{18}$ and $S_{19}$ of the second switching network are activated when feedback signal fbn is asserted. It should be understood that DAC 352 is just one of many possible DAC structures that may be incorporated into embodiment ΣΔ ADCs. For example, instead of a one-bit DAC, a multi-bit DAC may be implemented.

Figure 4:
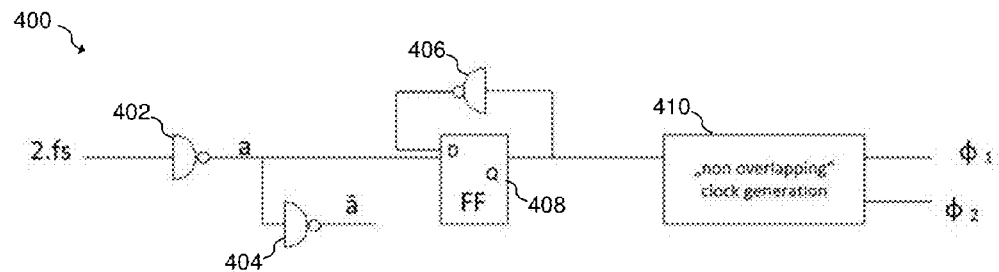
FIG. 4 illustrates a schematic of an embodiment clock generator circuit.

FIG. 4 illustrates a clock generator circuit 400 that may be used to implement a portion of controller 220 shown in FIG. 2a. As shown, clock generator circuit 400 includes inverters 402 that produce signals a and ā from double clock frequency signal 2.fs. Register 408 with feedback inverter 406 divides the frequency of signal in two to generate a logic pulse having a frequency of fs. Non-overlapping clock generator 410 generates phases Ø1 and Ø2 in manner that they do not overlap in that signals Ø1 and Ø2 are prevented from being asserted at the same time. Non-overlapping clock generating circuit 410 may be implemented using non-overlapping clock generation circuits known in the art.

Figure 5:
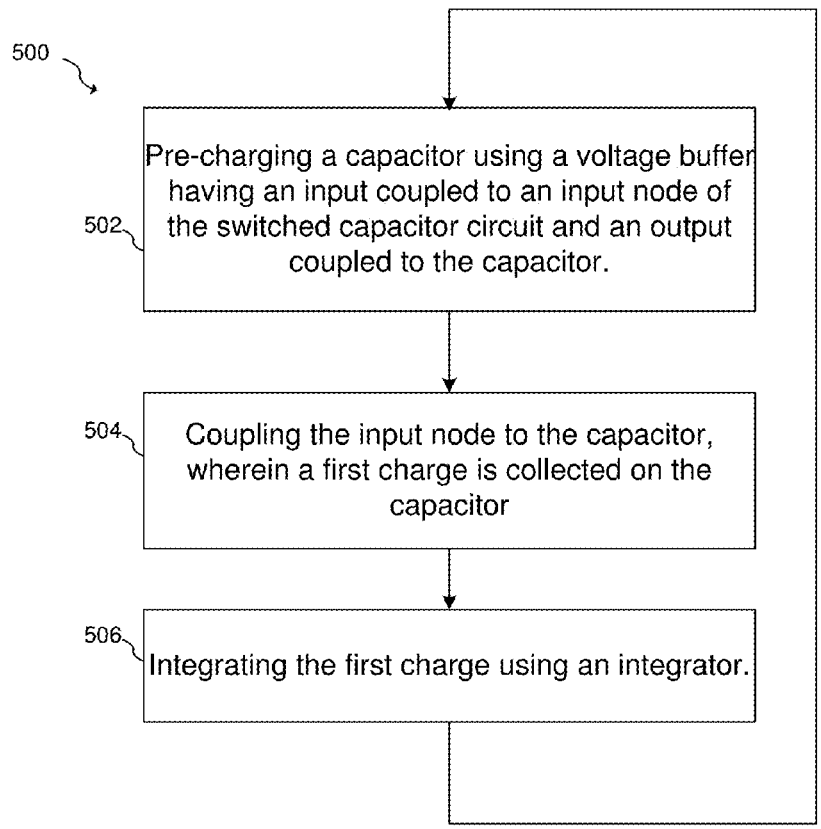
FIG. 5 illustrates a block diagram of an embodiment method.

FIG. 5 illustrates a flow chart of a method 500 of operating a switched capacitor circuit according to an embodiment of the present invention. In step 502, a capacitor is pre-charged using a voltage buffer having an input coupled to an input node of the switched capacitor circuit and an output coupled to the capacitor. By using a voltage buffer such as voltage buffer 214 described above with respect to FIG. 2a or voltage buffers 302 and 304 described above with respect to FIGS. 3a and 3b, the capacitor may be at least partially charged without loading the input node of the switched capacitor filter. As such, the input node of the switched capacitor filter may be coupled to a high impedance source and/or a high resistance may be coupled between the input node of the switched capacitor circuit and the capacitor in order, for example, to provide protection against high voltages and currents at the input node. In some embodiments, the voltage buffer may be configured to only partially charge the capacitor.

In step 504, the input node is coupled to capacitor such that a first charge is collected on the capacitor. In embodiments, where the capacitor is partially charged, the remaining charge needed to charge the capacitor is provided to the input node by a source coupled to the input node of the switched capacitor circuit. Because the capacitor is at least partially charged, however, the total amount of charge provided by the source coupled to the input node of the switched capacitor circuit is reduced to circuits in which input buffers are not employed.

In step 506, the first charge is integrated using an integrator. In some embodiments, the integrator may be implemented using an amplifier having a capacitor in feedback such as amplifier 216 and feedback capacitor CF described above with respect to FIG. 2a and amplifier 306 and feedback capacitors CFA and CFB described above with respect to FIG. 3. For example, with respect to the embodiment of FIG. 2a, the charge on capacitor CS is transferred to capacitor $C_F$ by closing switches $S_E$ and $S_B$. Because the charge transferred from capacitor CS to capacitor $C_F$ is added to charge that is already stored on capacitor $C_F$ amplifier 216 in conjunction with feedback capacitor $C_F$ effectively functions as an integrator. After step 506, operation may resume with step 502.

Figure 6:
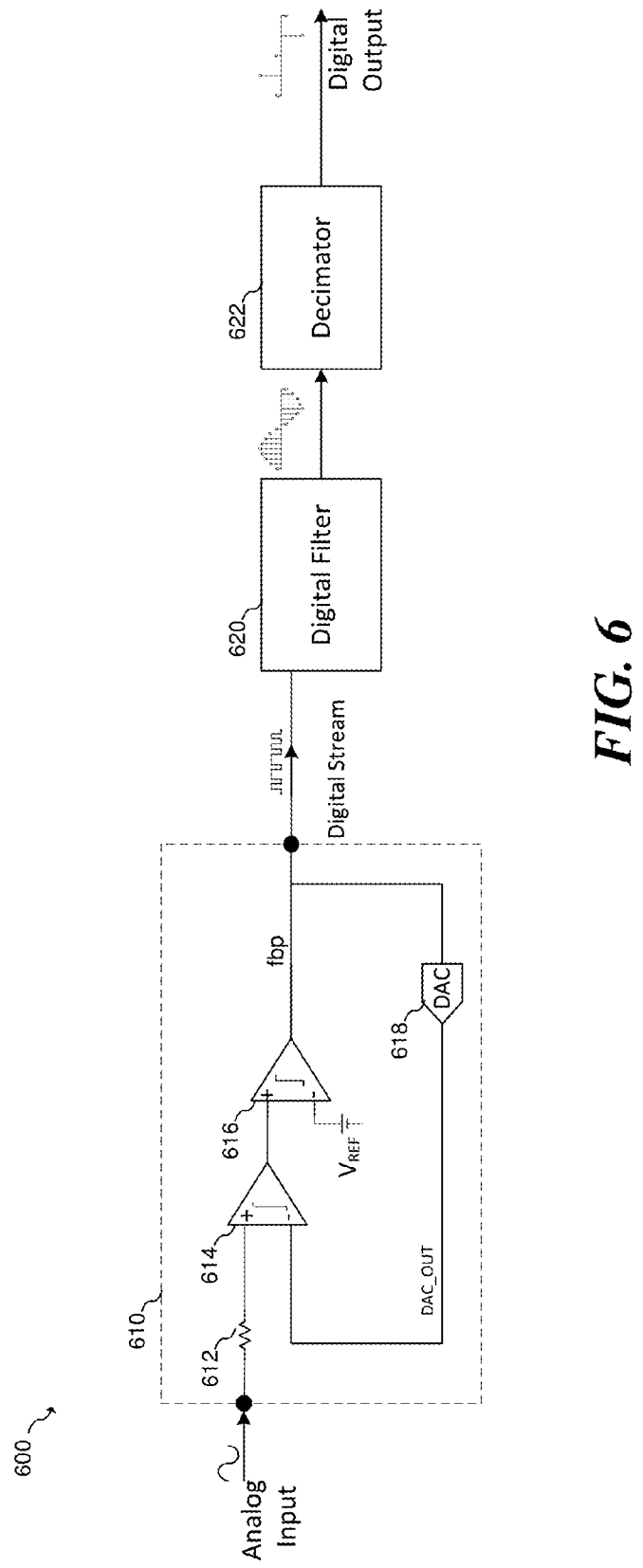
FIG. 6 illustrates a block diagram of an embodiment ΣΔ analog-to-digital converter.

FIG. 6 illustrates block diagram of ΣΔ ADC 600 that utilizes an embodiment switched capacitor integrator. As shown, ΣΔ ADC 600 includes a modulator 610, digital filter 620 and decimator 622. Modulator 610 samples the analog input and produces a digital bitstream, digital filter 620 lowpass filters the digital bitstream and decimator 622 downsamples the output of digital filter 620. In one example embodiment, modulator 610 samples the analog input at a sample rate of 20 MHz, digital filter 620 has a bandwidth of 100 kHz, and decimator 622 reduces the sample by a factor of 100 down to 200 kHz. It should be understood that these sampling rates and bandwidths are just one of many possible examples, and that other sampling rates and bandwidths could be used in alternative embodiments.

Modulator 610 is includes integrator 614, quantizer and digital-to-analog converter (DAC) 618. Integrator 614 is implemented using an embodiment switched capacitor integrator circuits, such as those that are described above. Quantizer 616 quantizes the output out integrator 614 to produce the digital bitstream. In some embodiments, quantizer 616 may be a single bit quantizer that is implemented using a comparator circuit known in the art. Alternatively, quantizer 616 may be a multi-bit quantizer implemented, for example, using a flash analog-to-digital converter. DAC 618 converts the digital bitstream into analog voltage DAC_OUT suitable for input to integrator 614. In some embodiments, resistor 612 is coupled to the input of integrator 614 to limit voltage and current transients seen at the analog input. While modulator 610 is illustrated as a first order modulator having a single-ended input, higher order modulators and/or differential inputs may be used in alternative embodiments depending on the particular embodiments and its specifications.

Digital filter 620 may be implemented using a digital low pass averaging filter and/or other types of lowpass filters known in the art. Decimator 622 is configured to downsample the output of digital filter 620 by a factor of n by selecting one of out every n samples provided by digital filter 620, and may be implemented using decimation filters known in the art. Digital filter 620 and decimation filter 622 may be implemented, for example, on an integrated circuit using custom or standard cell logic, using a digital signal processor (DSP) or other types of digital logic known in the art. In various embodiments, all elements of ΣΔ ADC 600 may be implemented as a single integrated circuit on a single semiconductor substrate, or may be partitioned among separate circuits.

Example embodiments of the present invention are summarized here. Other embodiments can also be understood from the entirety of the specification and the claims filed herein.

Example 1

A method of operating a switched capacitor circuit, the method including: pre-charging a capacitor using a voltage buffer having an input coupled to an input node of the switched capacitor circuit and an output coupled to the capacitor; coupling the input node to the capacitor, where a first charge is collected on the capacitor; and integrating the first charge using an integrator.

Example 2

The method of example 1, further including: quantizing the integrated first charge to form a quantized value; and feeding back the quantized value to the capacitor.

Example 3

The method of examples 1 or 2, further including decimating the quantized value.

Example 4

The method of one of examples 1 to 3, where: coupling the input node to the capacitor includes coupling the input node to the capacitor via a resistor; and the voltage buffer has a settling time of less than five times an RC time constant of the resistor and the capacitor.

Example 5

A switched capacitor circuit including: a capacitor; a first switch having a first node coupled to input port of the switched capacitor circuit and a second node coupled to the capacitor; a voltage buffer having an input coupled to the first node of the first switch and an output coupled to the capacitor; a second switch coupled between the output of the voltage buffer and the capacitor; and a controller. In a first phase, the controller is configured to deactivate the first switch and activate the second switch, where the capacitor is disconnected from the input port via the first switch and the capacitor is connected to the output of the voltage buffer by the second switch. In a second phase after the first phase, the controller is configured to activate the first switch and deactivate the second switch, where the capacitor is connected to the input port via the first switch and the capacitor is disconnected from the output of the voltage buffer by the second switch.

Example 6

The switched capacitor circuit of example 5, further including an integrator coupled to the capacitor, the integrator configured to integrate charge of the capacitor.

Example 7

The switched capacitor circuit of examples 5 or 6, further including a resistor coupled between the input port of the switched capacitor circuit and the first node of the first switch.

Example 8

The switched capacitor circuit of example 7, where the voltage buffer has a settling line of less than five time constants, where each time constant is a product of a resistance of the resistor and a capacitance of the capacitor.

Example 9

The switched capacitor circuit of one of examples 5 to 8, where the capacitor, voltage buffer, first switch and second switch are disposed on an integrated circuit.

Example 10

An integrated circuit including: a first capacitor network; a first switch network coupled between an input pin of the integrated circuit and a first port of the first capacitor network; a voltage buffer having an input coupled to the first port of the first capacitor network; a second switch network coupled between an output of the voltage buffer and the first port of the first capacitor network; and a controller. In a first phase, the controller is configured to deactivate the first switch network and activate the second switch network, where the first capacitor network is disconnected from the input pin via the first switch network and the first capacitor network is connected to the output of the voltage buffer by the second switch network. In a second phase after the first phase, the controller is configured to activate the first switch network and deactivate the second switch network, where the first capacitor network is connected to the input pin via the first switch network and the first capacitor network is disconnected from the output of the voltage buffer by the second switch network.

Example 11

The integrated circuit of example 10, further including an integration circuit coupled to a second port of the first capacitor network; and a third switch network coupled between the integration circuit and the second port of the first capacitor network. The controller is further configured to deactivate the third switch network during the first phase and the second phase, where the integration circuit is disconnected from the first capacitor network, and activate the third switch network during a third phase after the second phase, where the integration circuit is connected to the first capacitor network.

Example 12

The integrated circuit of example 11, where the controller is further configured to: in the third phase, activate the second switch network and deactivate the first switch network; and in a fourth phase after the third phase, activate the first switch network, deactivate the second switch network and activate the third switch network.

Example 13

The integrated circuit of example 12, where: the first capacitor network includes a first capacitor and a second capacitor; the voltage buffer includes a first buffer having an input coupled to a first terminal of the first port and second buffer having an input coupled to a second terminal of the first port; during the first phase and the third phase, the second switch network is configured to connect an output of the first buffer to a first terminal of the first capacitor, and to connect an output of the second buffer to a first terminal of the second capacitor; and during the second phase and the fourth phase, the first switch network is configured to connect the first terminal of the first port to the first terminal of the first capacitor, and to connect the second terminal of the second port to the first terminal of the second capacitor.

Example 14

The integrated circuit of example 13, where: during the third phase and the fourth phase, the third switch network is configured to connect a second terminal of the first capacitor to a first input node of the integration circuit, and is configured to connect a second terminal of the second capacitor a second input node of the integration circuit; and during the first phase and the second phase, the third switch network is configured to disconnect the second terminal of the first capacitor from the first input node of the integration circuit, disconnect the second terminal of the second capacitor from the second input node of the integration circuit, and connect the second terminal of the first capacitor to the second terminal of the second capacitor.

Example 15

The integrated circuit of example 14, where the third switch network is further configured to connect the second terminal of the first capacitor and the second terminal of the second capacitor to a common mode reference voltage.

Example 16

The integrated circuit of one of examples 10-15, where the integration circuit includes: an amplifier having an input coupled to the first capacitor network; and a capacitor coupled between the input of the amplifier and an output of an amplifier.

Example 17

The integrated circuit of one of examples 10 to 16, further including: a quantizer having an input coupled to an output of the integration circuit; and a digital to analog converter having an input coupled an output of the quantizer and an output coupled to the controller.

Example 18

The integrated circuit of one of examples 10 to 17, further including a resistor having a first end coupled to the input pin and a second end coupled to first switch network and the input of the voltage buffer.

Example 19

The integrated circuit of claim 18, where the voltage buffer has a settling time of less than five times an RC time constant of the resistor and a capacitance of the first capacitor network.

Advantages of embodiments of the present invention include the ability to operate a switch capacitor circuit with a high source impedance by pre-charging a capacitor using a voltage buffer. In embodiments in which the voltage buffer is configured to only partially charge the capacitor, the power used by the voltage buffer may be advantageously reduced, while high linearity is maintained. A further advantage includes the ability to interface a switched capacitor filter to a source that is prone to high voltage current disturbances.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a switched capacitor circuit, the method comprising:
    pre-charging a capacitor using a voltage buffer having an input coupled to an input node of the switched capacitor circuit and an output coupled to the capacitor via a first switch;
    coupling the input node to the capacitor via a second switch, wherein a first charge is collected on the capacitor; and
    integrating the first charge using an integrator.

2. The method of claim 1, further comprising:
    quantizing the integrated first charge to form a quantized value; and
    feeding back the quantized value to the capacitor.

3. The method of claim 2, further comprising decimating the quantized value.

4. The method of claim 1, wherein:
    coupling the input node to the capacitor comprises coupling the input node to the capacitor via a resistor; and
    the voltage buffer has a settling time of less than five times an RC time constant of the resistor and the capacitor.

5. A switched capacitor circuit comprising:
    a capacitor;
    a first switch having a first node coupled to an input port of the switched capacitor circuit and a second node coupled to the capacitor;
    a voltage buffer having an input coupled to the first node of the first switch and an output coupled to the capacitor;
    a second switch coupled between the output of the voltage buffer and the capacitor; and
    a controller configured to
        in a first phase, deactivate the first switch and activate the second switch, wherein the capacitor is disconnected from the input port via the first switch and the capacitor is connected to the output of the voltage buffer by the second switch, and
        in a second phase after the first phase, activate the first switch and deactivate the second switch, wherein the capacitor is connected to the input port via the first switch and the capacitor is disconnected from the output of the voltage buffer by the second switch.

6. The switched capacitor circuit of claim 5, further comprising an integrator coupled to the capacitor, the integrator configured to integrate charge of the capacitor.

7. The switched capacitor circuit of claim 5, further comprising a resistor coupled between the input port of the switched capacitor circuit and the first node of the first switch.

8. The switched capacitor circuit of claim 7, wherein the voltage buffer has a settling line of less than five time constants, wherein each time constant is a product of a resistance of the resistor and a capacitance of the capacitor.

9. The switched capacitor circuit of claim 5, wherein the capacitor, voltage buffer, first switch and second switch are disposed on an integrated circuit.

10. An integrated circuit comprising:
    a first capacitor network;
    a first switch network coupled between an input pin of the integrated circuit and a first port of the first capacitor network;
    a voltage buffer having an input coupled to the first port of the first capacitor network;
    a second switch network coupled between an output of the voltage buffer and the first port of the first capacitor network; and
    a controller configured to
        in a first phase, deactivate the first switch network and activate the second switch network, wherein the first capacitor network is disconnected from the input pin via the first switch network and the first capacitor network is connected to the output of the voltage buffer by the second switch network, and
        in a second phase after the first phase, activate the first switch network and deactivate the second switch network, wherein the first capacitor network is connected to the input pin via the first switch network and the first capacitor network is disconnected from the output of the voltage buffer by the second switch network.

11. The integrated circuit of claim 10, further comprising:
    an integration circuit coupled to a second port of the first capacitor network; and
    a third switch network coupled between the integration circuit and the second port of the first capacitor network, wherein the controller is further configured to, deactivate the third switch network during the first phase and the second phase, wherein the integration circuit is disconnected from the first capacitor network, and activate the third switch network during a third phase after the second phase, wherein the integration circuit is connected to the first capacitor network.

12. The integrated circuit of claim 11, wherein the controller is further configured to:

in the third phase, activate the second switch network and deactivate the first switch network; and in a fourth phase after the third phase, activate the first switch network, deactivate the second switch network and activate the third switch network.

13. The integrated circuit of claim 12, wherein:

the first capacitor network comprises a first capacitor and a second capacitor;

the voltage buffer comprises a first buffer having an input coupled to a first terminal of the first port and second buffer having an input coupled to a second terminal of the first port;

during the first phase and the third phase, the second switch network is configured to connect an output of the first buffer to a first terminal of the first capacitor, and to connect an output of the second buffer to a first terminal of the second capacitor; and during the second phase and the fourth phase, the first switch network is configured to connect the first terminal of the first port to the first terminal of the first capacitor, and to connect the second terminal of the second port to the first terminal of the second capacitor.

14. The integrated circuit of claim 13, wherein:

during the third phase and the fourth phase, the third switch network is configured to connect a second terminal of the first capacitor to a first input node of the integration circuit, and is configured to connect a second terminal of the second capacitor a second input node of the integration circuit; and during the first phase and the second phase, the third switch network is configured to disconnect the second terminal of the first capacitor from the first input node of the integration circuit, disconnect the second terminal of the second capacitor from the second input node of the integration circuit, and connect the second terminal of the first capacitor to the second terminal of the second capacitor.

15. The integrated circuit of claim 14, wherein the third switch network is further configured to connect the second terminal of the first capacitor and the second terminal of the second capacitor to a common mode reference voltage.

16. The integrated circuit of claim 11, wherein the integration circuit comprises:

an amplifier having an input coupled to the first capacitor network; and a capacitor coupled between the input of the amplifier and an output of an amplifier.

17. The integrated circuit of claim 10, further comprising:

a quantizer having an input coupled to an output of the integration circuit; and a digital to analog converter having an input coupled an output of the quantizer and an output coupled to the controller.

18. The integrated circuit of claim 10, further comprising:

a resistor having a first end coupled to the input pin and a second end coupled to first switch network and the input of the voltage buffer.

19. The integrated circuit of claim 18, wherein the voltage buffer has a settling time of less than five times an RC time constant of the resistor and a capacitance of the first capacitor network.

* * * * *